(12) United States Patent
Xie et al.

(10) Patent No.: US 9,583,155 B1
(45) Date of Patent: Feb. 28, 2017

(54) SINGLE-ENDED SIGNAL SLICER WITH A WIDE INPUT VOLTAGE RANGE

(71) Applicant: Integrated Device Technology, Inc., San Jose, CA (US)

(72) Inventors: Yi Xie, Shanghai (CN); Yuan Zhang, Shanghai (CN)

(73) Assignee: Integrated Device Technology, Inc., San Jose, CA (US)

(*) Notice: Subject to any disclaimer, the term of this patent is extended or adjusted under 35 U.S.C. 154(b) by 0 days.

(21) Appl. No.: 15/093,876

(22) Filed: Apr. 8, 2016

(30) Foreign Application Priority Data

Apr. 6, 2016 (CN) .......................... 2016 1 0207698

(51) Int. Cl.
| | |
|---|---|
| *G11C 5/14* | (2006.01) |
| *G11C 5/06* | (2006.01) |
| *G11C 8/18* | (2006.01) |
| *G11C 7/22* | (2006.01) |
| *G11C 7/10* | (2006.01) |

(52) U.S. Cl.
CPC .............. *G11C 5/063* (2013.01); *G11C 7/1084* (2013.01); *G11C 7/22* (2013.01); *G11C 8/18* (2013.01); *G11C 5/147* (2013.01)

(58) Field of Classification Search
CPC ......... G11C 5/063; G11C 5/14; G11C 7/1084; G11C 7/22; G11C 8/08; G11C 5/1471
USPC ..... 365/230.08, 189.09, 189.11, 191, 210.11
See application file for complete search history.

(56) References Cited

U.S. PATENT DOCUMENTS

| | | | | |
|---|---|---|---|---|
| 5,844,853 | A * | 12/1998 | Kitsukawa | ....... G01R 31/31712 365/189.09 |
| 5,942,809 | A * | 8/1999 | Hashimoto | ............. G05F 1/465 307/112 |
| 6,166,969 | A * | 12/2000 | Song | .............. H03K 19/018521 327/333 |
| 8,089,813 | B2 * | 1/2012 | Dreps | ...................... G11C 5/04 365/185.2 |
| 2002/0141248 | A1 * | 10/2002 | Jang | ...................... G11C 5/146 365/189.09 |
| 2013/0223175 | A1 * | 8/2013 | Lee | .......................... G05F 1/56 365/228 |

* cited by examiner

*Primary Examiner* — Tan T. Nguyen
(74) *Attorney, Agent, or Firm* — Christopher P. Maiorana P.C.

(57) ABSTRACT

An apparatus includes a first circuit, a second circuit, and a third circuit. The first circuit may be configured to (i) reduce a current value in a sequence of input values that have been carried on a single-ended line of a data bus coupled to a memory channel to generate a version of the current value, and (ii) reduce a first reference voltage to generate a second reference voltage. The second circuit may be configured to slice the current value with respect to the first reference voltage to generate a first intermediate value. The third circuit may be configured to slice the version of the current value with respect to the second reference voltage to generate a second intermediate value. The first intermediate value and the second intermediate value generally define a sliced value of the current value.

20 Claims, 7 Drawing Sheets

SINGLE-ENDED SIGNAL SLICER WITH A WIDE INPUT VOLTAGE RANGE

This application relates to Chinese Application No. 201610207698.3, filed Apr. 6, 2016, which is hereby incorporated by reference in its entirety.

FIELD OF THE INVENTION

The invention relates to signal slicing generally and, more particularly, to a method and/or apparatus for implementing a single-ended signal slicer with a wide input voltage range.

BACKGROUND

Conventional interfaces of DDR4 SDRAM (double data rate fourth generation synchronous dynamic random-access memory) operate at data rates of up to 3.2 gigabits per second. Channel degradation can cause a data eye at a receiver side of the interface to be closed. Dielectric and resistive losses of printed-circuit-board traces contribute to the channel degradation. The traces present frequency dependent attenuations that cause pulse dispersions and inter-symbol interference (ISI). Impedance discontinuities from connectors and via stubs in the signal path cause reflections that generate more ISI and further reduce a signal-to-noise ratio. As the data rate of a DDR4 SDRAM is increased, the channel loss and the reflections become significant.

It would be desirable to implement a single-ended signal slicer with a wide input voltage range.

SUMMARY

The invention concerns an apparatus including a first circuit, a second circuit, and a third circuit. The first circuit may be configured to (i) reduce a current value in a sequence of input values that have been carried on a single-ended line of a data bus coupled to a memory channel to generate a version of the current value, and (ii) reduce a first reference voltage to generate a second reference voltage. The second circuit may be configured to slice the current value with respect to the first reference voltage to generate a first intermediate value. The third circuit may be configured to slice the version of the current value with respect to the second reference voltage to generate a second intermediate value. The first intermediate value and the second intermediate value generally define a sliced value of the current value.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the invention include providing a single-ended signal slicer with a wide input voltage range that may (i) have a small propagation delay, (ii) operate two slicers in parallel, (iii) reduce or eliminate inter-symbol interference, (iv) compensate for channel loss and reflection, (v) receive single-ended signals, (vi) be implemented in memory interfaces and/or (vii) be implemented within an integrated circuit.

Various embodiments of the invention generally provide a slicer circuit capable of operating over a wide input voltage range. The slicer circuit generally provides a dual slicer structure to cover the wide input voltage range. Each dual slicer may be implemented with devices (e.g., transistors) designed to operate in a low core voltage domain to obtain propagation timing benefits. Transmission gates may be implemented to minimize or prevent potential over-voltage reliability risks at input nodes of the devices.

In one slicer of the dual slicer structure, gates of NMOS input transistors are generally used as the input nodes. The NMOS-input slicer may work well when a data/reference voltage common-mode voltage is higher than a turn-on threshold voltage of the input transistors. When the reference voltage gets lower (e.g., one-third of a power voltage domain), the NMOS-input slicer generally operates slower. Therefore, the other slicer of the dual slicer structure may use gates of PMOS input transistors as parallel input nodes. Though the reference voltage may be one-third of the voltage domain, a gate-to-source voltage on the PMOS transistors may be sufficiently large to sample the data with a short propagation delay.

Figure 1:
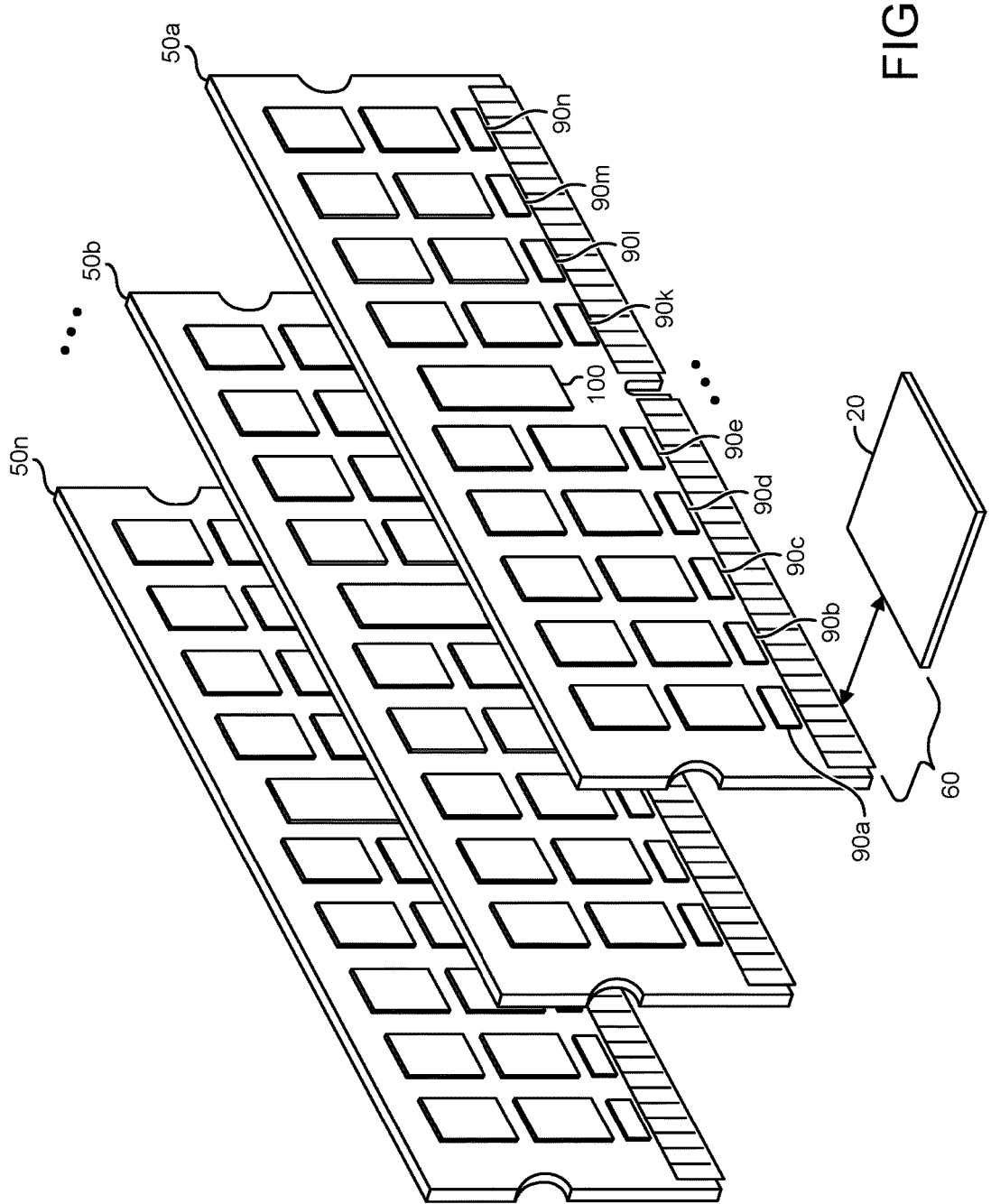
FIG. 1 is a diagram illustrating multiple memory modules.

Referring to FIG. 1, a diagram illustrating a number of example circuits $50a$-$50n$ are shown. In an example, circuits $50a$-$50n$ may be implemented as memory modules (or boards). For example, the memory modules $50a$-$50n$ may be implemented as double data rate fourth generation (DDR4) synchronous dynamic random-access memory (SDRAM) modules. The memory modules $50a$-$50n$ may comprise a number of blocks (or circuits) $90a$-$90n$, a block (or circuit) 100, and/or various other blocks, circuits, pins, connectors and/or traces. The circuits $90a$-$90n$ may be configured as data buffers. The circuit 100 may be implemented as a registered clock driver (RCD). In an example, the RCD circuit 100 may be implemented as a DDR4 RCD circuit. The type, arrangement and/or number of components of the memory modules $50a$-$50n$ may be varied to meet the design criteria of a particular implementation.

The memory modules $50a$-$50n$ are shown connected to a block (or circuit) 20. The circuit 20 may be a memory controller. The circuit 20 may be located in another device, such as a computing engine. Various connectors/pins/traces 60 may be implemented to connect the memory modules $50a$-$50n$ to the memory controller 20. In some embodiments, the connectors/pins/traces 60 may be a 288-pin configuration. In an example, the memory controller 20 may be a component of a computer motherboard. In another example, the memory controller 20 may be a component of a microprocessor. In yet another example, the memory controller 20 may be a component of a central processing unit (CPU).

In an example, some of the connectors/pins/traces 60 may be part of the memory modules $50a$-$50n$ and some of the connectors/pins/traces 60 may be part of the motherboard and/or memory controller 20. The memory modules $50a$-$50n$ may be connected to a computer motherboard (e.g., by pins, traces and/or connectors 60) to transfer data between components of a computing device and the memory modules 50a-50n. In an example, the memory controller 20 may be implemented on a northbridge of a motherboard and/or as a component of a microprocessor (e.g., an Intel CPU, an AMD CPU, an ARM CPU, etc.). The implementation of the memory controller 20 may be varied according to the design criteria of a particular implementation.

In various embodiments, the memory modules 50a-50n may be DDR4 SDRAM memory modules. The DDR4 SDRAM memory modules 50a-50n may have a memory module density of 512 gigabyte (GB), terabyte, or higher per module (e.g., compared to 128 GB per dual in-line memory module (DIMM) in DDR3). The DDR4 SDRAM memory modules 50a-50n may operate at voltages of 1.2-1.35 volts (V) with a frequency between 800-2133 megahertz (MHz) (e.g., compared to 1.5-1.65V at frequencies between 400-1067 MHz in DDR3). In some embodiments, the memory modules 50a-50n may be implemented as low voltage DDR4 and operate at 1.05V. For example, the DDR4 SDRAM memory modules 50a-50n may implement 35% power savings compared to DDR3 memory. The DDR4 SDRAM memory modules 50a-50n may transfer data at speeds of 2.13-4.26 giga-transfers per second (GT/s) and higher (e.g., compared to 0.8-2.13GT/s in DDR3). The operating parameters of the memory modules 50a-50n may be varied according to the design criteria of a particular implementation.

In an example, the memory modules 50a-50n may be compliant with the DDR4 specification titled "DDR4 SDRAM", specification JESD79-4A, November 2013, published by the Joint Electron Device Engineering Council (JEDEC) Solid State Technology Association, Arlington, Va. Appropriate sections of the DDR4 specification are hereby incorporated by reference in their entirety.

The memory modules 50a-50n may be implemented as DDR4 load reduced DIMM (LRDIMM) or DDR4 registered DIMM (RDIMM). The data buffers 90a-90n may allow the memory modules 50a-50n in a DDR4 LRDIMM configuration to operate at higher bandwidth and/or at higher capacities compared to DDR4 RDIMM (e.g., 1333 MT/s for DDR4 LRDIMM compared to 1067 MT/s for DDR4 RDIMM at 384 GB capacity). For example, compared to DDR4 RDIMM configurations, the DDR4 LRDIMM configuration of the memory modules 50a-50n may allow improved signal integrity on data signals, lower component latency through the data buffers 90a-90n and/or better intelligence and/or post-buffer awareness by the memory controller 20.

Figure 2:
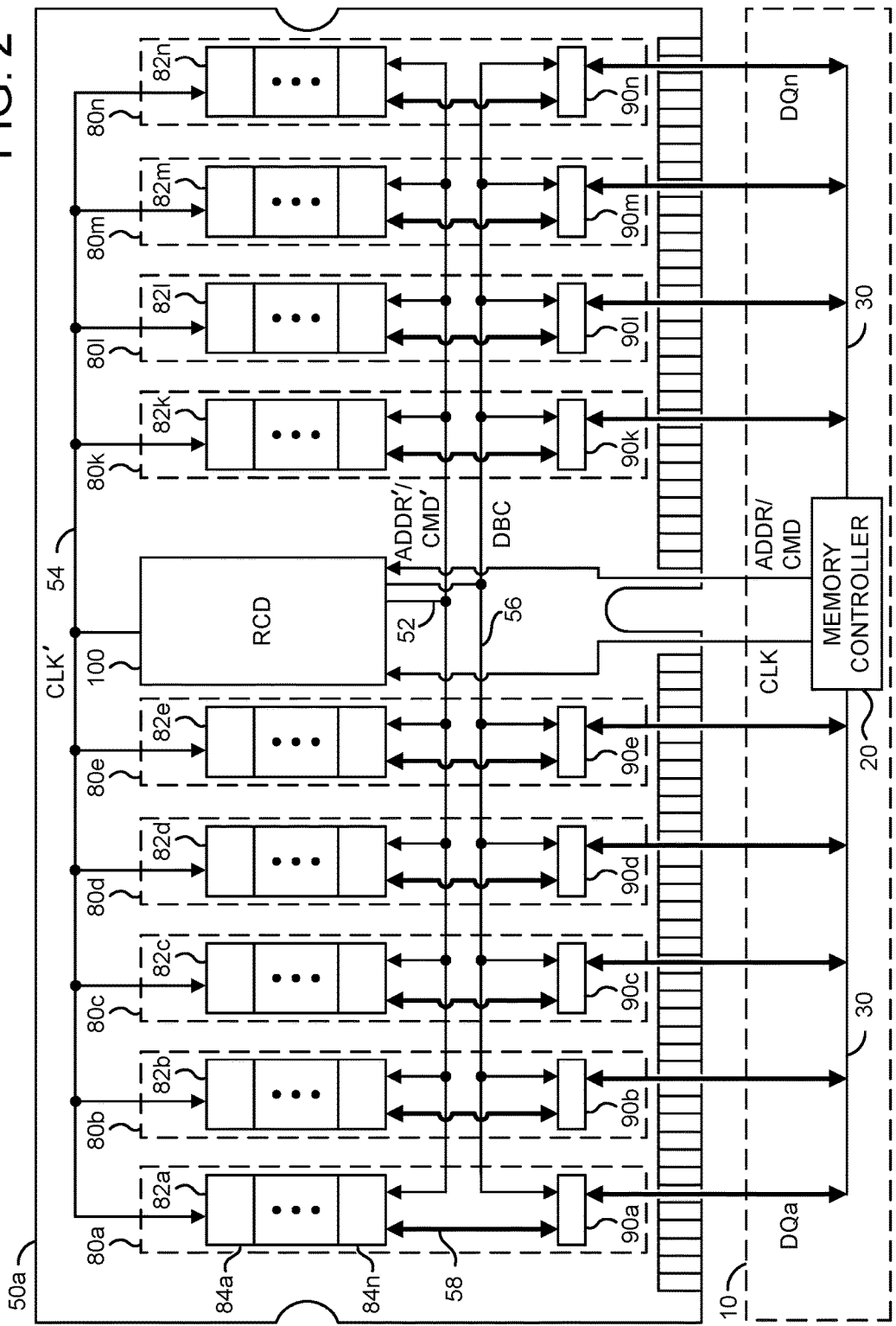
FIG. 2 is a block diagram illustrating a memory module.

Referring to FIG. 2, a block diagram illustrating a memory module 50a is shown. The memory module 50a may be representative of the memory modules 50b-50n. The memory module 50a is shown communicating with the memory controller 20. The memory controller 20 is shown as part of a block (or circuit) 10. The circuit 10 may be a motherboard, or other electronic component or computing engine that communicates with the memory module 50a.

The memory module 50a may comprise one or more blocks (or circuits) 80a-80n and/or the RCD circuit 100. The circuits 80a-80n may implement data paths of the memory module 50a. For example, the data path 80a may include the blocks 82a and/or the data buffer 90a. The data paths 80b-80n may have a similar implementations. The circuits 82a-82n may each be implemented as a memory channel. Each of the memory channels 82a-82n may comprise a number of blocks (or circuits) 84a-84n. The circuits 84a-84n may be implemented as random access memory (RAM) chips. For example, the RAM chips 84a-84n may implement a volatile memory such as dynamic RAM (DRAM). In some embodiments, the RAM chips 84a-84n may be physically located on both sides (e.g., the front and back) of the circuit board of the memory modules 50a-50n. A capacity of memory on the memory module 50a may be varied according to the design criteria of a particular implementation.

The memory controller 20 may generate a signal (e.g., CLK) and a number of control signals (e.g., ADDR/CMD). The signal CLK and/or the signals ADDR/CMD may be presented to the RCD circuit 100. A data bus 30 may be connected between the memory controller and the data paths 80a-80n. The memory controller 20 may generate and/or receive data signals (e.g., DQa-DQn) that may be presented/received from the data bus 30. The signals DQa-DQn may be presented to each of the data paths 80a-80n.

The RCD circuit 100 may be configured to communicate with the memory controller 20, the memory channels 82a-82n and/or the data buffers 90a-90n. The RCD circuit 100 may decode instructions received from the memory controller 20. For example, the RCD circuit 100 may receive register command words (RCWs). In another example, the RCD circuit 100 may receive buffer control words (BCWs). The RCD circuit 100 may be configured to train the DRAM chips 84a-84n, the data buffers 90a-90n and/or command and address lines between the memory controller 20. For example, the RCWs may flow from the memory controller 20 to the RCD circuit 100. The RCWs may be used to configure the RCD circuit 100.

The RCD circuit 100 may be used in both LRDIMM and RDIMM configurations. The RCD circuit 100 may implement a 32-bit 1:2 command/address register. The RCD circuit 100 may support an at-speed bus (e.g., a BCOM bus between the RCD circuit 100 and the data buffers 90a-90n). The RCD circuit 100 may implement automatic impedance calibration. The RCD circuit 100 may implement command/address parity checking. The RCD circuit 100 may control register RCW readback. The RCD circuit 100 may implement a 1 MHz inter-integrated circuit ($I^2C$) bus (e.g., a serial bus). Inputs to the RCD circuit 100 may be pseudo-differential using external and/or internal voltages. The clock outputs, command/address outputs, control outputs and/or data buffer control outputs of the RCD circuit 100 may be enabled in groups and independently driven with different strengths.

The RCD circuit 100 may receive the signal CLK and/or the signals ADDR/CMD from the memory controller 20. Various digital logic components of the RCD circuit 100 may be used to generate signals based on the signal CLK and/or the signals ADDR/CMD and/or other signals (e.g., RCWs). The RCD circuit 100 may also be configured to generate a signal (e.g., CLK') and signals (e.g., ADDR'/CMD'). For example, the signal CLK' may be a signal Y_CLK in the DDR4 specification. The signal CLK' and/or the signals ADDR'/CMD' may be presented to each of the memory channels 82a-82n. For example, the signals CLK' and/or ADDR'/CMD' may be transmitted on a common bus 54. The RCD circuit 100 may generate one or more signals (e.g., DBC). The signals DBC may be presented to the data buffers 90a-90n. The signals DBC may be transmitted on a common bus 56 (e.g., a data buffer control bus).

The data buffers 90a-90n may be configured to receive data from the bus 56. The data buffers 90a-90n may be configured to generate/receive data to/from the bus 30. The bus 30 may comprise traces, pins and/or connections between the memory controller 20 and the data buffers 90a-90n. A bus 58 may carry the data between the data buffers 90a-90n and the memory channels 82a-82n. The data buffers 90a-90n may be configured to buffer data on the buses 30 and 58 for write operations (e.g., data transfers from the memory controller 20 to the corresponding memory channels 82a-82n). The data buffers 90a-90n may be configured to buffer data on the buses 30 and 58 for read operations (e.g., data transfers from the corresponding memory channels 82a-82n to the memory controller 20).

The data buffers 90a-90n may exchange data with the DRAM chips 84a-84n in small units (e.g., 4-bit nibbles). In various embodiments, the DRAM chips 84a-84n may be arranged in multiple (e.g., two) sets. For two set/two DRAM chip 84a-84b implementations, each set may contain a single DRAM chips 84a-84n. Each DRAM chip 84A-84b may be connected to the respective data buffers 90a-90n through an upper nibble and a lower nibble. For two set/four DRAM chip 84a-84d implementations, each set may contain two DRAM chips 84a-84d. A set may be connected to the respective data buffers 90a-90n through the upper nibble. The other set may be connected to the respective data buffers 90a-90n through the lower nibble. For two set/eight DRAM chip 84a-84h implementations, each set may contain four of the DRAM chips 84a-84h. A set of four DRAM chips 84a-84d may connect to the respective data buffers 90a-90n through the upper nibble. The other set of four DRAM chips 84e-84h may connect to the respective data buffers 90a-90n through the lower nibble. Other numbers of sets, other numbers of DRAM chips, and other data unit sizes may be implemented to meet the design criteria of a particular implementation.

The DDR4 LRDIMM configuration may reduce a number of data loads to improve signal integrity on a data bus (e.g., the bus 30) of the memory module from a maximum of several (e.g., four) data loads down to a single data load. The distributed data buffers 90a-90n may allow DDR4 LRDIMM designs to implement shorter I/O trace lengths compared to DDR3 LRDIMM designs, that use a centralized memory buffer. For example, shorter stubs connected to the memory channels 82a-82n may result in less pronounced signal reflections (e.g., improved signal integrity). In another example, the shorter traces may result in a reduction in latency (e.g., approximately 1.2 nanoseconds (ns), that is 50% less latency than DDR3 buffer memory). In yet another example, the shorter traces may reduce I/O bus turnaround time. For example, without the distributed data buffers 90a-90n (e.g., in DDR3 memory applications) traces would be routed to a centrally located memory buffer, increasing trace lengths up to six inches compared to the DDR4 LRDIMM implementation shown in FIG. 2.

In some embodiments, the DDR4 LRDIMM configuration may implement nine of the data buffers 90a-90n. The memory modules 50a-50n may implement 2 millimeter (mm) frontside bus traces and backside traces (e.g., the connectors/pins/traces 60). A propagation delay through the data buffers 90a-90n may be 33% faster than through a DDR3 memory buffer (e.g., resulting in reduced latency). In some embodiments, the data buffers 90a-90n may be smaller (e.g., a reduced area parameter) than a data buffer used for DDR3 applications.

Figure 3:
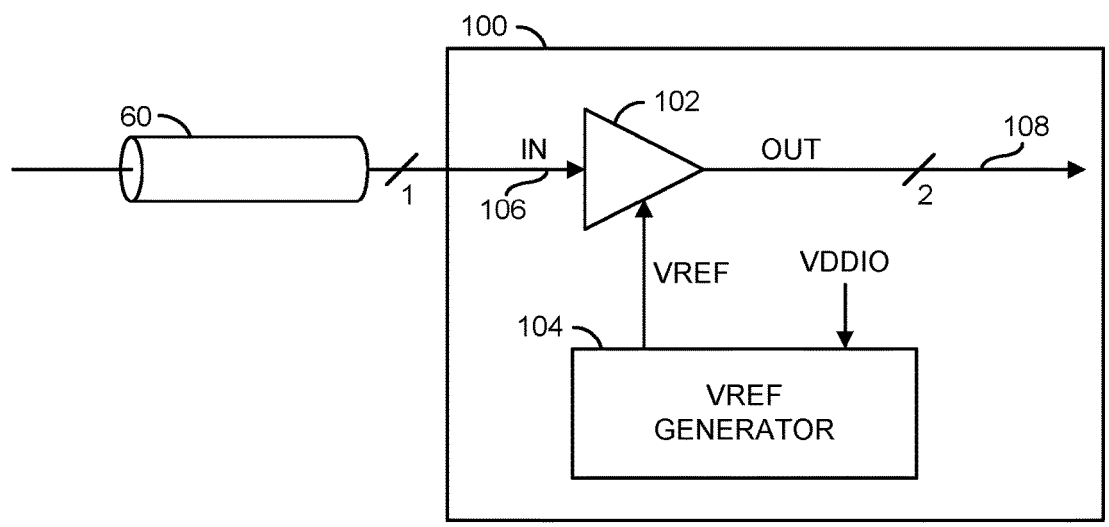
FIG. 3 is a block diagram of a receiver portion of a registered clock driver circuit.

Referring to FIG. 3, a block diagram of a receiver portion of the RCD circuit 100 is shown in accordance with an embodiment of the present invention. The receiver portion generally comprises an equalization block (or circuit) 102 and reference voltage generator block (or circuit) 104.

An input signal (e.g., IN) may be received by the circuit 102 from the connectors/pins/traces 60. In various embodiments, the signal IN may represent any of the commands in the signal CMD, the addresses in the signal ADDR and/or other information transferred from the memory controller 20 to the RCD circuit 100. An input/output voltage (or power) domain (e.g., VDDIO) may be received by the circuit 104. The circuit 104 may generate a reference signal (e.g., VREF) presented to the circuit 102. The signal VREF may convey a fixed reference voltage. An output signal (e.g., OUT) may be generated by the circuit 102. The signal OUT may carry an equalized version of the information bits (or pulses) received in the signal IN. The signal OUT may be implemented as a differential signal.

The circuit 102 may implement a decision feedback equalization (DFE) circuit. The DFE circuit 102 may be operational to convert the single-ended signal IN into the differential signal OUT. Within the DFE circuit 102, prior bit decisions are generally used and subtracted in a feedback loop. The DFE circuit 102 may subtract a post-cursor or a pre-cursor inter-symbol interference without amplifying high-frequency noise or cross-talk and so may achieve a better signal-to-noise ratio than other equalization techniques.

The DFE circuit 102 may be used in multi-drop single-ended applications for channel equalization. A K-tap direct-feedback DFE operation may be suitable for DDR4 memory interface applications where a short propagation delay (e.g., less than 40 picoseconds) may be helpful to maintain a tight timing budget. The DFE circuit 102 may be implemented with core transistors (e.g., NMOS transistors) as input devices to achieve a small set-up time and ck-q delay. Voltage levels in the differential signal OUT generated by the DFE circuit 102 generally do not exceed a maximum operating voltage of a core voltage domain VDDC (e.g., 0.9 volts) used by the core transistors.

The DFE circuit 102 generally eliminates a use of a preceding continuous-time linear equalizers (CTLE) and/or limiting amplifiers (LA) on the input signal. The lack of CTLE and LA circuitry reduces propagation delay introduced into the timing path compared to common designs. The DFE circuit 102 may be configured to improve a data eye height and improve width shmoo results for the information in the signal IN. Because the information in the signal IN and the reference voltage signal VREF comes from the input/output voltage domain VDDIO (e.g., 1.2 volts), the DFE circuit 102 is generally placed under the input/output voltage domain VDDIO. The DFE circuit 102 is generally configured to create a suitable voltage swing in the differential signal OUT.

The circuit 104 may implement a reference voltage (VREF) generation circuit. The VREF circuit 104 may be operational to provide a fixed reference voltage in the signal VREF to multiple (e.g., up to 33) copies of the DFE circuit 102. In some embodiments, the signal VREF may be generated as a fraction (e.g., half) of the input/output voltage domain VDDIO. Other reference voltages may be generated to meet the design criteria of a particular implementation. In various embodiments, multiple instantiations of the reference voltage generator circuit 104 may be implemented based on the number of the DFE circuits 102 that consume the signal VREF.

Figure 4:
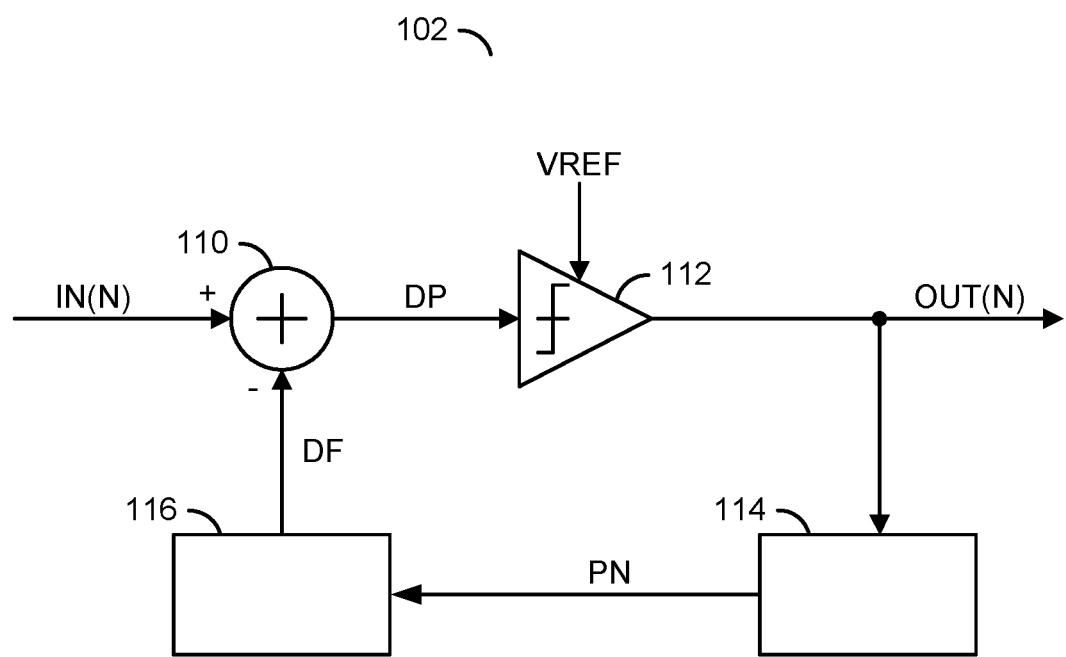
FIG. 4 is a block diagram of a decision feedback equalization circuit.

Referring to FIG. 4, a block diagram of an example implementation of the DFE circuit 102 is shown. The DFE circuit 102 generally comprises a block (or circuit) 110, a block (or circuit) 112, a block (or circuit) 114 and a block (or circuit) 116. The signal IN may be received by the circuit 110. The circuit 110 may receive a signal (e.g., DF) from the circuit 116. The signal DF may transfer an equalization value (or correction data) used to adjust the data in the signal IN.

A signal (e.g., DP) may be generated by the circuit 110 and transferred to the circuit 112. The signal DP may carry a difference between the signal IN and the signal DF. The circuit 112 may generate the signal OUT. The signal OUT may be received by the circuit 114. The circuit 114 may generate a signal (e.g., PN). The signal PN may provide correction information for the data in the signal IN. The signal PN may be received by the circuit 116.

The circuit 110 may implement a summation circuit. The circuit 110 is generally operational to sum an inverse of the data in the signal DF to the signal IN to generate the signal DP. The addition of the inverse data (subtraction of the data) in the signal DF generally subtracts a post-cursor or a pre-cursor inter-symbol interference (ISI) from a current sample (e.g., a sample N) of the data in the signal IN (e.g., IN(N)).

The circuit 112 may implement a slicer circuit. The slicer 112 may be operational to convert the single-ended signal DP into the differential signal OUT based on a reference voltage received in the signal VREF. Data input voltage sampling relative to the reference voltage generally takes effect on a specific (e.g., low to high) transition of the clock signal CLK. A higher-voltage between two input branches of the slicer 112 may prevail and drive more current from a corresponding latch. When the clock signal CLK transitions from high to low, the latch may hold the current state and wait for a next data sampling. When the data in the signal DP is higher than the signal VREF on a positive edge of the signal CLK, the slicer 112 may sample a high voltage (e.g., a logical one). When the data in the signal DP is lower than the signal VREF on the positive edge of the clock signal CLK, the slicer 112 may sample a low voltage (e.g., a logical zero). A shaped version of the information received in the signal DP for the sample N may be carried in the signal OUT (e.g., OUT(N)). The shaping generally retains level portions of the information that represent nominal values of the information in intervals between consecutive transitions.

The circuit 114 may implement a DFE decoder circuit. The DFE decoder circuit 114 is generally operational to delay one or more samples received in the signal OUT and multiply the delayed samples by a multiplication factor. A resulting product of the multiplication may be used to generate multiple control values in the signal PN.

The circuit 116 may implement an amplifier circuit. The amplifier circuit 116 is generally operational to generate the signal DF based on the control values received in the signal PN. In various embodiments, the control values in the signal PN may be used to control a pair of current values in the signal DF. An example implementation of the DFE circuit 102 may be found in co-pending U.S. application Ser. No. 15/079,370, filed Mar. 24, 2016, which is hereby incorporated by reference in its entirety.

Figure 5:
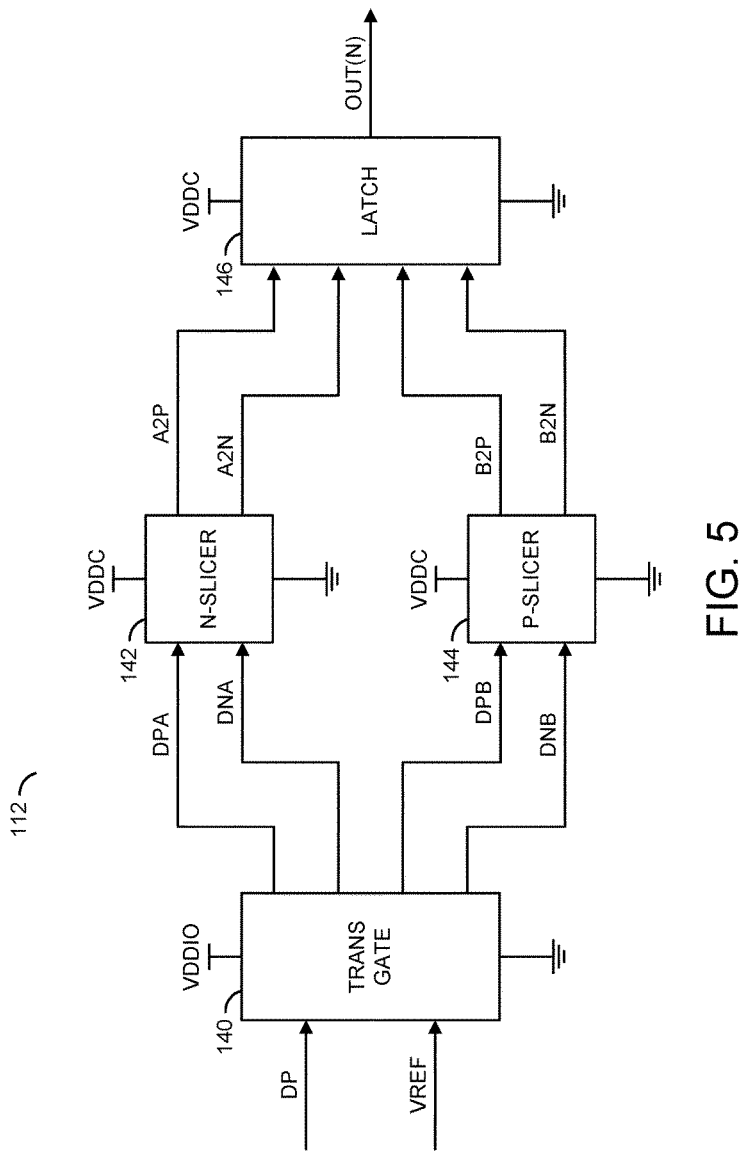
FIG. 5 is a block diagram of a slicer circuit.

Referring to FIG. 5, a block diagram of an example implementation of the slicer 112 is shown. The slicer 112 generally comprises a block (or circuit) 140, a block (or circuit) 142, a block (or circuit) 144, and a block (or circuit) 146. The signal DP may be received by the circuit 140. The signal VREF may be received by the circuit 140. The circuit 146 may generate the signal OUT(N).

A pair of signals (e.g., DPA and DNA) may be generated by the circuit 140 and transferred to the circuit 142. The signal DPA generally carries the data from the signal DP. The signal DNA may carry the reference voltage received in the signal VREF. The circuit 140 may generate a pair of signals (e.g., DPB and DNB) received by the circuit 144. The signal DPB may be a voltage-reduced version of the data in the signal DPA. The signal DNB may be a voltage-reduced version of reference voltage in the signal DNA. A pair of signals (e.g., A2P and A2N) may be generated by the circuit 142 and presented to the circuit 146. The signals A2P and A2N may convey a differential sliced version of the data in the signal DPA. The circuit 146 may receive a differential pair of signals (e.g., B2P and B2N) generated by the circuit 144. The signals B2P and B2N may convey a differential sliced version of the data in the signal DPB.

The circuit 140 may implement a transmission gate circuit. The transmission gate 140 is generally operational to clamp the data in the signals DP and VREF in a voltage range. The voltage range may be between a positive rail in the input/output voltage domain VDDIO and signal ground. The clamped voltages may be presented in the signals DPA and DNA, respectively. The transmission gate 140 may also be operational to generate the voltage-reduced versions of the data and the reference voltage using a pair of transmission (or pass) gates. To prevent potential over-voltage issue on input devices of the P-slicer 144, a transmission gate may be placed between the data in the signal DP and the slicer 144. The transmission gate may transfer low voltages in the signal DP without any loss, and reduce high voltages in the signal DP by a transistor turn-on threshold voltage. For good symmetry, a similar transmission gate may be placed on the path of the signal VREF. The voltage-reduced versions of the data and the reference voltage may be presented in the signals DPB and DNB, respectively.

The circuit 142 may implement an N-slicer circuit. The N-slicer 142 is generally operational to slice the data received in the signal DPA relative to the reference voltage received in the signal DNA, generating a first intermediate sliced data value. The first intermediate sliced data value may be presented in the differential signals A2P and A2N. The N-slicer 142 may operate in the core voltage domain VDDC.

The circuit 144 may implement a P-slicer circuit. The P-slicer 144 is generally operational to slice the data received in the signal DPB relative to the reference voltage received in the signal DNB, generating a second intermediate sliced data value. The second intermediate sliced data value may be presented in the differential signals B2P and B2N. The P-slicer 144 may operate in the core voltage domain VDDC.

The circuit 146 may be implemented as a latch circuit. The latch 146 is generally operational to latch the sliced data based on the signals A2P, A2N, B2P and B2N. The latched data may be presented in the signal OUT(N). The latch 146 may operate in the core voltage domain VDDC.

Figure 6:
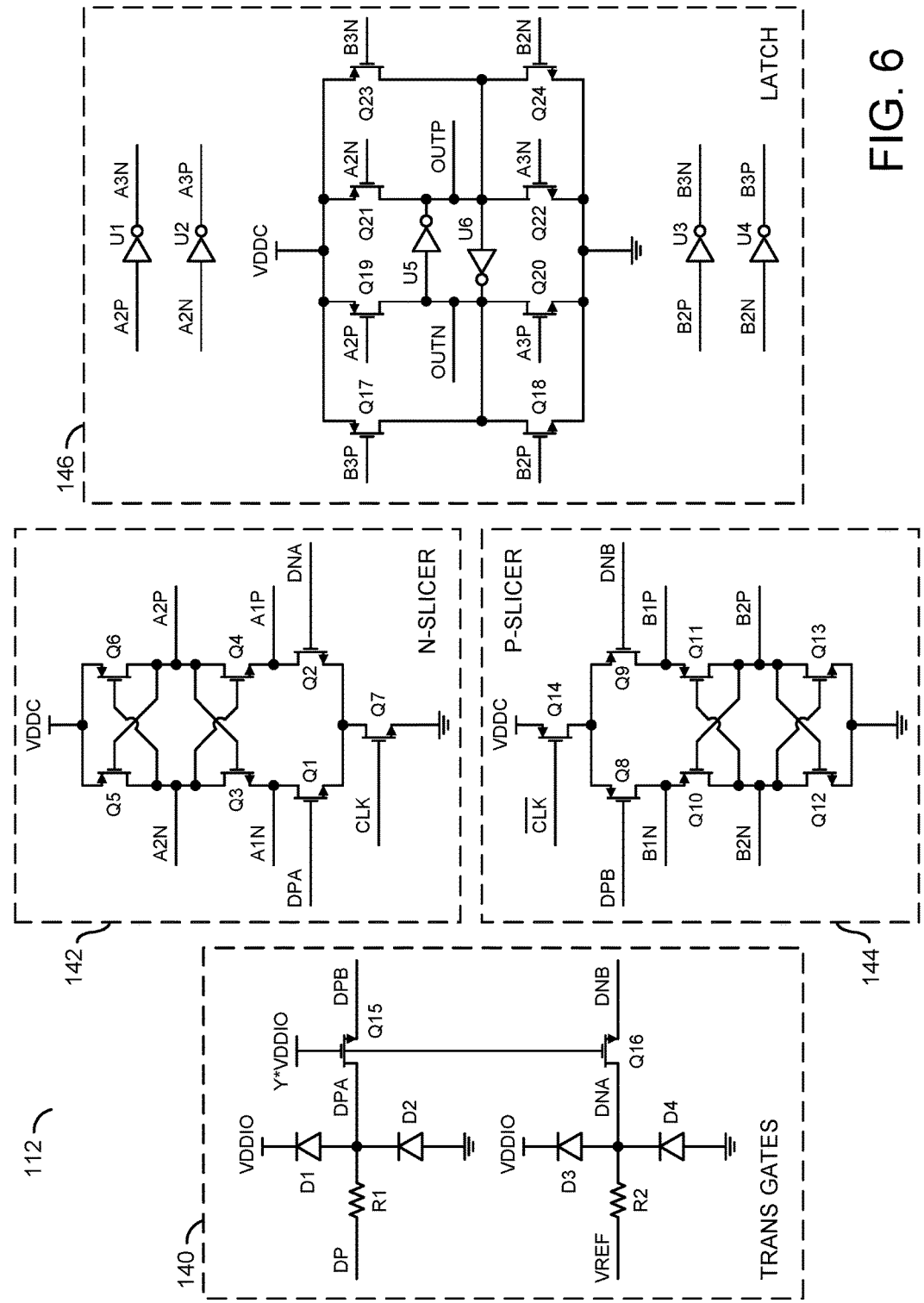
FIG. 6 is a schematic diagram of the slicer circuit.

Referring to FIG. 6, a schematic diagram of an example implementation of the slicer 112 is shown. The slicer 112 generally integrates the summation circuit 110 (see FIG. 4). A prior data bit may be sampled by the slicer 112 and transferred to the DFE decoder circuit 114. A series of branches in the signals PN may be connected in parallel with the amplifier 116. The amplifier 116 may generate multiple components in the signal DF (e.g., signals A1P, A1N, B1P and B1N) connected in parallel as input pairs to the N-slicer 142 and the P-slicer 144. The connections may implement a negative summation of the current received in the signals IN/VREF and the feedback signal DF.

The circuit 140 generally comprises multiple resistors R1 and R2, multiple diodes D1 to D4 and multiple transistors Q15 and Q16. The resistor R1 and the diodes D1 and D2 may be configured as a clamping circuit for the signal DP. The resistor R2 and the diodes D3 and D4 may be configured as a clamping circuit for the signal VREF.

The diode D1 may prevent the voltage of the signal DPA from exceeding the high rail of the input/output voltage domain VDDIO (e.g., 1.2 volts) by a diode threshold voltage. The diode D2 may prevent the voltage of the signal DPA from falling below the signal ground by more than the diode threshold voltage. The transistor Q15 may be configured as a transmission gate. The transistor Q15 generally provides a controlled voltage drop in the signal DPA to generate the signal DPB. In various embodiments, the transistor Q15 may be implemented as an NMOS transistor. A gate of the transistor Q15 may be set at a fraction Y (e.g., Y=0.8 to 0.925) of the input/output voltage domain VDDIO to limit a highest voltage in the signal DPB. The signal DPB may reside in the core voltage domain VDDC (e.g., 0.9 volts).

The diode D3 may prevent the voltage of the signal VREF from exceeding the high rail of the input/output voltage domain VDDIO by the diode threshold voltage. The diode D4 may prevent the voltage of the signal VREF from falling below the signal ground by more than the diode threshold voltage. The transistor Q16 may be configured as a transmission gate. The transistor Q16 may provide a controlled voltage drop in the signal DNB to generate the signal DNB. In various embodiments, the transistor Q16 may be implemented as an NMOS transistor. A gate of the transistor Q16 may be set at the fraction Y of the input/output voltage domain VDDIO to limit a highest voltage in the signal DNB. The signal DNB may reside in the core voltage domain VDDC.

The N-slicer 142 generally comprises multiple transistors Q1 to Q7. In various embodiments, the transistors Q1 to Q4 and Q7 may be implemented as NMOS transistors. The transistors Q5 and Q6 may be implemented as PMOS transistors. Other transistor types may be implemented to meet the design criteria of a particular application.

The transistors Q1 to Q6 may be arranged as a differential amplifier. In various embodiments, the transistors Q1 and Q2 may be implemented as native 12 transistors (e.g., transistors that have a turn-on threshold voltage of approximately zero volts). The signal DPA may be received by a gate of the transistor Q1. The signal A1N may be connected to a node that connects a drain of the transistor Q1 to a source of the transistor Q3. The signal A2N may be connected to a node that connects a drain of the transistor Q3 to a source of the transistor Q5.

The signal DNA may be received by a gate of the transistor Q2. The signal A1P may be connected to a node that connects a drain of the transistor Q2 to a source of the transistor Q4. The signal A2P may be connected to a node that connects a drain of the transistor Q4 to a source of the transistor Q6.

The sources of the transistors Q1 and Q2 may be connected to a drain of the transistor Q7. A gate of the transistor Q7 may receive the signal CLK. A source of the transistor Q7 may be connected to the signal ground.

The gates of the transistors Q3 and Q4 may be cross-coupled to the opposite sources. The gates of the transistors Q5 and Q6 may be cross-coupled to the opposite sources. The drains of the transistors Q3 and Q4 may be connected to the respective sources of the transistors Q5 and Q6. The drains of the transistors Q5 and Q6 may be connected to the core voltage domain VDDC.

The P-slicer 144 generally comprises multiple transistors Q8 to Q14. In various embodiments, the transistors Q12 and Q13 may be implemented as NMOS transistors. The transistors Q8 to Q11 and Q14 may be implemented as PMOS transistors. Other transistor types may be implemented to meet the design criteria of a particular application.

The transistors Q8 to Q13 may be arranged as a differential amplifier. In various embodiments, the transistors Q8 and Q9 may be implemented as low threshold voltage transistors. The signal DPB may be received by a gate of the transistor Q8. The signal B1N may be connected to a node that connects a drain of the transistor Q8 to a source of the transistor Q10. The signal B2N may be connected to a node that connects a drain of the transistor Q10 to a drain of the transistor Q12.

The signal DNB may be received by a gate of the transistor Q9. The signal B1P may be connected to a node that connects a drain of the transistor Q9 to a source of the transistor Q11. The signal B2P may be connected to a node that connects a source of the transistor Q11 to a source of the transistor Q13.

The sources of the transistors Q8 and Q9 may be connected to a drain of the transistor Q14. A gate of the transistor Q14 may receive an inverse of the signal CLK (e.g., $\overline{CLK}$). A source of the transistor Q14 may be connected to the core voltage domain VDDC.

The gates of the transistors Q10 and Q11 may be cross-coupled to the opposite drains. The gates of the transistors Q12 and Q13 may be cross-coupled to the opposite drains. The drains of the transistors Q10 and Q11 may be connected to the respective drains of the transistors Q12 and Q13. The sources of the transistors Q12 and Q13 may be connected to the signal ground.

The latch 146 generally comprises multiple transistors Q17 to Q24 and multiple inverters U1 to U5. Two of the inverters (U1 and U2) may invert the signals A2P and A2N to generate the signals A3N and A3P, respectively. Two of the inverters (U3 and U4) may invert the signals B2P and B2N to generate the signals B3N and B3P, respectively. A latch may be formed by two of the inverters (U5 and U6).

Gate of the transistors Q17 to Q24 may receive the signals B3P, B2P, A2P, A3P, A2N, A3N, B3N and B2N, respectively. The transistors Q17 and Q19 may be connected between the core voltage domain VDDC and an input of the inverter U5. The transistors Q18 and Q20 may be connected between the signal ground and the input of the inverter U5. The transistors Q21 and Q23 may be connected between the core voltage domain VDDC and an input of the inverter U6. The transistors Q22 and Q24 may be connected between the signal ground and the input of the inverter U6. The signal OUTN may be generated by the inverter U6. The signal OUTP may be generated by the inverter U5.

Simulations of the slicer 112 generally show good timing performance over a wide voltage range of the signal VREF from 0.33×VDD to 0.67×VDD, where VDD may be a system voltage domain VDD (e.g., 1.2 volts). Simulation results of slicer propagation delay (Tpd) in picoseconds (ps) over a range of voltages in the signal VREF, while VREF=VDD×Kref, is generally provided in Table I as follows:

TABLE I

| Kref | 0.25 | 0.3 | 0.35 | 0.4 | 0.45 | 0.5 | 0.55 | 0.6 | 0.65 | 0.7 | 0.75 |
|---|---|---|---|---|---|---|---|---|---|---|---|
| Tpd_f (ps) | 85.1 | 88.7 | 91.4 | 91.9 | 92.0 | 92.3 | 92.7 | 93.1 | 93.4 | 93.7 | 94.6 |
| Tpd_r (ps) | 83.0 | 84.5 | 86.5 | 88.8 | 89.6 | 89.7 | 89.7 | 89.8 | 90.1 | 90.6 | 91.5 |

The simulations generally show similar delay performance (e.g., less than 100 ps) over the voltage range of the signal VREF.

Figure 7:
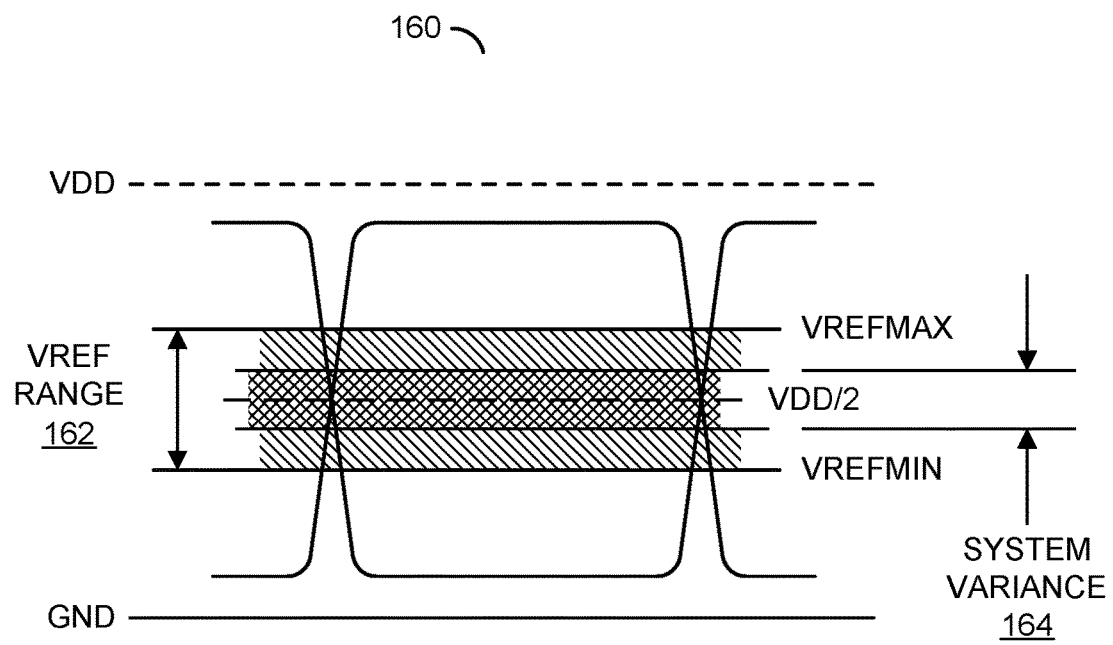
FIG. 7 is a diagram of an expected operating range of a reference voltage.

Referring to FIG. 7, a diagram 160 of an expected operating range of the signal VREF is shown. The signal VREF generally resides in the system voltage domain VDD. In various embodiments, the input/output voltage domain VDDIO may match the system voltage domain VDD.

The DDR4 specification generally sets an input slicer reference voltage operating range 162 due to the channel degradation between a transmitter output of the host 92 and a receiver input of the RCD circuit 100. The voltage of the signal VREF may range from a minimum operating point (e.g., VREFMIN of 0.33×VDD) to a maximum operating point (e.g., VREFMAX of 0.67×VDD). In common applications, the voltage in the signal VREF may range over a system variance 164 smaller than the operating range 162. The system variance 164 is generally centered approximately midway in the input/output voltage domain VDD.

While FIG. 4 generally shows the slicer 112 in the context of the RCD circuit 100 while receiving information, copies of the slicer 112 may be implemented at other locations, other data paths and/or other control paths. In some embodiments, copies of the slicer 112 may be located in the data buffer circuits 90a-90n to improve the signals received from the memory controller 20 during write cycles. In various embodiments, copies of the slicer 112 may be located at the other end of the data bus 30 to improve various signals generated by the memory modules 50a-50n and received by the memory controller 20. For example, the memory controller 20 may include copies of the slicer 112 to read data sent in the signals DQa-DQn from the memory modules 50a-50n during a read cycle. Instances of the slicer 112 may also be implemented in other circuitry within the memory modules 50a-50n.

Although embodiments of the invention have been described in the context of a DDR4 application, the present invention is not limited to DDR4 applications, but may also be applied in other high data rate digital communication applications where different transmission line effects, cross-coupling effects, traveling wave distortions, phase changes, impedance mismatches and/or line imbalances may exist. The present invention addresses concerns related to high speed communications, flexible clocking structures, specified command sets and lossy transmission lines. Future generations of DDR can be expected to provide increasing speed, more flexibility, additional commands and different propagation characteristics. The present invention may also be applicable to memory systems implemented in compliance with either existing (legacy) memory specifications or future memory specifications.

The functions and structures illustrated in the diagrams of FIGS. 1 to 6 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages. Embodiments of the present invention may be utilized in connection with flash memory, nonvolatile memory, random access memory, read-only memory, magnetic disks, floppy disks, optical disks such as DVDs and DVD RAM, magneto-optical disks and/or distributed storage systems.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element. As used herein, the term "simultaneously" is meant to describe events that share some common time period but the term is not meant to be limited to events that begin at the same point in time, end at the same point in time, or have the same duration.

While the invention has been particularly shown and described with reference to embodiments thereof, it will be understood by those skilled in the art that various changes in form and details may be made without departing from the scope of the invention.

The invention claimed is:

1. An apparatus comprising:
   a first circuit configured to (i) reduce a current value in a sequence of input values that have been carried on a single-ended line of a data bus coupled to a memory channel to generate a reduced version of said current value, and (ii) reduce a first reference voltage to generate a second reference voltage;
   a second circuit configured to slice said current value with respect to said first reference voltage to generate a first intermediate value; and
   a third circuit configured to slice said reduced version of said current value with respect to said second reference voltage to generate a second intermediate value, wherein said first intermediate value and said second intermediate value define a sliced value of said current value.

2. The apparatus according to claim 1, further comprising a fourth circuit configured to latch said sliced value of said current value in response to said first intermediate value and said second intermediate value.

3. The apparatus according to claim 2, wherein (i) said first circuit comprises a plurality of transmission gates in a registered clock driver (RCD) circuit, (ii) said second circuit comprises a first slicer with NMOS input transistors in said RCD circuit, (iii) said third circuit comprises a second slicer with PMOS input transistors in said RCD circuit, and (iv) said fourth circuit comprises a latch in said RCD circuit.

4. The apparatus according to claim 3, wherein said RCD circuit is at least double data rate fourth generation (DDR4) compliant.

5. The apparatus according to claim 1, wherein (i) said first circuit, said sequence of input values, and said first reference voltage are in a first voltage domain, (ii) said second circuit and said third circuit operate in a second voltage domain, and (iii) said first voltage domain has a higher voltage range than said second voltage domain.

6. The apparatus according to claim 1, wherein (i) said first circuit comprises a plurality of voltage clamps configured to receive said sequence of input values and said first reference voltage, and (ii) a plurality of NMOS transistors configured to generate said reduced version of said current value and said second reference voltage.

7. The apparatus according to claim 1, wherein said second circuit comprises a plurality of native transistors configured to receive said first reference voltage and said current value.

8. The apparatus according to claim 1, wherein said third circuit comprises a plurality of PMOS transistors each with a low threshold voltage and configured to receive said second reference voltage and said reduced version of said current value, wherein said low threshold voltage is as low as one-third a power supply voltage.

9. The apparatus according to claim 1, wherein said apparatus introduces a delay of at most 100 picoseconds.

10. The apparatus according to claim 1, wherein said data bus is an address/command bus of a double data rate (DDR) memory module.

11. The apparatus according to claim 10, wherein said DDR memory module comprises a double data rate fourth generation (DDR4) dual in-line memory module (DIMM).

12. A method of slicing a sequence of input values, comprising the steps of:
 receiving at a circuit a first reference voltage and a current value in said sequence of input values that have been carried on a single-ended line of a data bus coupled to a memory channel;
 reducing said current value in said sequence of input values to generate a reduced version of said current value;
 reducing said first reference voltage to generate a second reference voltage;
 slicing said current value in said sequence of input values with respect to said first reference voltage to generate a first intermediate value; and
 slicing said reduced version of said current value with respect to said second reference voltage to generate a second intermediate value, wherein said first intermediate value and said second intermediate value define a sliced value of said current value.

13. The method according to claim 12, further comprising the step of:
 latching said sliced value of said current value in response to said first intermediate value and said second intermediate value.

14. The method according to claim 12, wherein (i) said sequence of input values and said first reference voltage are in a first voltage domain, (ii) said first intermediate value, said second intermediate value and said second reference voltage are in a second voltage domain, and (iii) said first voltage domain has a higher voltage range than said second voltage domain.

15. The method according to claim 12, wherein the steps are at least double data rate fourth generation (DDR4) compliant.

16. The method according to claim 12, wherein said current value in said sequence of input values is sliced with respect to said first reference voltage using a plurality of native transistors.

17. The method according to claim 12, wherein (i) said reduced version of said current value is sliced with respect to said second reference voltage using a plurality of PMOS transistors each with a low threshold voltage and (ii) said low threshold voltage is as low as one-third a power supply voltage.

18. The method according to claim 12, wherein a change in an output signal is delayed at most 100 picoseconds from an edge in a clock signal.

19. The method according to claim 12, wherein said data bus is an address/command bus of a double data rate (DDR) memory module.

20. The method according to claim 19, wherein said DDR memory module comprises a double data rate fourth generation (DDR4) dual in-line memory module (DIMM).

* * * * *